United States Patent [19]

Roake

[11] E Patent Number: Re. 32,546

[45] Reissued Date of Patent: Nov. 24, 1987

[54] APPARATUS FOR SECURING AN ELECTRONIC UNIT TO AN AVIONICS TRAY

[75] Inventor: Joseph C. Roake, Lyme, near Chertsey, England

[73] Assignee: Barry Wright Corporation, Newton Lower Falls, Mass.

[21] Appl. No.: 750,113

[22] Filed: Dec. 3, 1985

Related U.S. Patent Documents

Reissue of:

[64] Patent No.: 4,506,439
Issued: Mar. 26, 1985
Appl. No.: 528,903
Filed: Sep. 1, 1983

[30] Foreign Application Priority Data

Sep. 3, 1982 [GB] United Kingdom ..... 8225126
Sep. 3, 1982 [GB] United Kingdom ..... 8225138

[51] Int. Cl.[4] ..... F16H 27/02

[52] U.S. Cl. ..... 74/89.15; 29/747; 29/758; 29/764; 361/395; 361/399; 439/350

[58] Field of Search ..... 29/764, 747, 758, 741; 81/3 R; 74/89.15, 99 A, 56; 339/91 R; 361/395, 397, 399, 413, 415

[56] References Cited

U.S. PATENT DOCUMENTS 3,147,005 9/1964 Miller ..... 269/237
4,223,934 9/1980 Canceglia et al. ..... 29/764 X

*Primary Examiner*—Carl E. Hall
*Attorney, Agent, or Firm*—Milton E. Gilbert; James W. Mitchell

[57] ABSTRACT

Apparatus for removing and securing a plug-in electronic unit or the like to or from an avionics tray comprises a threaded spindle carrying a transverse pin at one end thereof and having an arrangement of three concentric sleeves located about the spindle. Stop members are provided to limit the movement of the sleeves in both axial directions along the threaded spindle. A rotatable grip is fitted about the innermost of the three concentric sleeves at that end of the sleeve remote from the transverse pin. A ring member is positioned about the middle of the three sleeves and cooperates with an extended flange of the latter to define an annular recess which contains a resilient element. A torque-limiting arrangement is provided between the rotatable grip and a co-operating surface portion of the middle of the three sleeves. The outermost sleeve has, its end closest to the transverse pin, a radial flange which together with said ring member defines an annular recess capable of receiving a hook forming part of the attachment mechanism of an electronic unit. In use, rotation of the rotatable grip allows an electronic unit to be inserted into an avionics tray with a predetermined degree of force, this being adjusted via the torque limiting arrangement. Rotation of the rotatable grip in the opposite sense effects removal of the electronic unit from the avionics tray.

9 Claims, 6 Drawing Figures

APPARATUS FOR SECURING AN ELECTRONIC UNIT TO AN AVIONICS TRAY

Matter enclosed in heavy brackets [ ] appears in the original patent but forms no part of this reissue specification; matter printed in italics indicates the additions made by reissue.

This invention relates to apparatus for securing an electronic unit or the like to an avionics tray.

Electronic equipment for use in aircraft has been generally standardised into set sizes of electronic units. These units are supported on avionics trays which are likewise of standardised sizes.

When an electronic unit is mounted onto an avionics tray, electrical connections must be made in order to allow the proper functioning of the equipment. Usually, the electronic unit is provided with a bank of pins which meet with a corresponding socket provided in or on the avionics tray. Because of the delicacy of the equipment and the need to ensure proper electrical connections, the method of mounting the unit on an avionics tray, and correspondingly of extracting the unit from the avionics tray, assumes an important role. In order to ensure proper electrical connection, an appropriate degree of force is required to insert the pins into their respective sockets. Too much force, however, could lead to damage to the electronic unit or to the connections, and therefore the appropriate insertion forces for a particular electronic unit can be defined within a relatively narrow range.

Early avionics equipment hold-downs consisted of a threaded spindle pivoted at one end on a pivot axis transverse to the longitudinal extent of the spindle; the spindle carried a butterfly nut having attached thereto a taper ring having a taper surface resembling a jaw facing the spindle pivot. By screwing the butterfly nut down towards the pivot, the taper ring could engage with a projecting hook provided on the front end of the electronics unit. At this stage, little attention was given to the question of force applied to the electronics unit. An arrangement of the kind just described is disclosed in Arinc Specification No. 404 relating to air transport equipment cases and racking, which was issued in May, 1956. Page 53 of the specification (data sheet 9B) states that care should be taken in the design of the hold-down screw arrangement in order to maintain proper relationship of the horizontal force tending to move the electronic equipment into the electrical connectors and the vertical force holding the equipment down on slide rails which are associated with the avionics tray.

According to the present invention, there is provided apparatus for removing and securing a plug-in electronic unit or the like from or to an avionics tray, which apparatus comprises:

(i) a threaded spindle one end of which includes a transverse pin for pivotally mounting the spindle in a retaining member attached to or forming part of the avionics tray such that the spindle can move about the transverse axis of said pin but cannot rotate about its own axis;

(ii) a first sleeve having a first portion relatively remote from the transverse pin and having a second, internally threaded portion which is threaded onto the spindle, the internal diameter of the first portion being slightly greater than the external diameter of the spindle;

(iii) a first stop member formed in or attached to the end of the first sleeve nearest to the transverse pin;

(iv) a second stop member arranged to limit the movement of the first sleeve with respect to the spindle in a direction away from the transverse pin;

(v) a rotatable grip fitted about that end of the first sleeve remote from the transverse pin;

(vi) a second sleeve coaxial with, and positioned around the first sleeve and having at its end remote from the transverse pin a radial flange including a shoulder facing towards the transverse pin, and an annular recess which co-operates with the rotatable grip and the first sleeve to define an annular cavity around the first sleeve;

(vii) a torque limiting arrangement positioned in said annular cavity and serving to interconnect the rotating grip and the first sleeve such that rotation of the grip in the direction towards the transverse pin causes the first sleeve to move along the threaded portion of the spindle towards the transverse pin so long as the torque between grip and said first sleeve is less than a predetermined value;

(viii) a ring member including (a) a sleeve portion coaxial with and positioned for sliding movement on the outer surface of the second sleeve, (b) an internal surface open towards the transverse pin, and (c) a shoulder facing towards, and capable of abutting, the shoulder of the second sleeve;

(ix) a third sleeve coaxial with and positioned for relative sliding movement over that part of the outer surface of the second sleeve nearest to the transverse pin, the third sleeve being retained at its end nearest to the transverse pin by the first stop member and having, at that end, (a) radially inwardly facing abutment which holds the third sleeve away from the first sleeve and which defines, in cooperation with the inner surface of the third sleeve, the outer sleeve of the first sleeve, and the end of the second sleeve, a sheath-like cavity around the first sleeve, and (b) a radially outwardly extending flange, the other end of said third sleeve being in contact with the radially inward part of the taper ring;

(x) a resilient element located in said sheath-like cavity and arranged so as to tend to urge the second and third sleeves away from one another in the axial direction of the spindle;

(xi) a generally cylindrical, elastomeric spacer element held between the radial flange of the second sleeve and that end of the ring member remote from the transverse pin, the arrangement being such that when the ring member and said radial flange move towards each other their respective shoulders come into abutment so as to retain the compressed elastomeric spacer element within a cavity defined between the ring member and said radial flange; and (xii) means for urging the rotating grip towards the torque limiting arrangement.

The second sleeve may be disposed for sliding movement around the first sleeve or it may be fixed to the first sleeve.

The torque limiting arrangement preferably comprises a plurality of ball bearings held against the surface of a drive plate, which surface is formed with a number of indents corresponding to the number of ball bearings. Each of the indents can conveniently be generally "L"-shaped in section. The drive plate is preferably keyed to the spindle.

The means for urging the rotating grip towards the torque limiting arrangement preferably comprises a pack of disc springs such as Belleville washers housed in an annular cavity formed between the outer wall portion of the rotating grip and the outer surface of the first sleeve, the disc springs being urged towards an inner face of the rotating grip through the action of an adjustable screw arrangement, e.g. in the form of an adjustment disc threadedly engaged with that end of the first sleeve remote from the transverse pin. By adjusting such a disc, the torque at which the torque limiting arrangement will slip can be varied.

It is preferred that the outer surface of the rotating grip be formed of rubber and be shaped so as to facilitate manual operation thereof.

It is also preferred that the outer surface of the rotating grip or at least a portion thereof be colour coded, a specific colour corresponding to the predetermined value of the torque at which the torque limiting arrangement will slip.

The transverse pin can be mounted in a slot which is inclined with respect to the support surface of the avionics tray, that end of the slot furthest from the rotating grip being slightly higher than the other end of the slot, when the avionics tray is in a horizontal position. Alternatively, the spindle may be provided with a pair of parallel and spaced transverse pins which ride over corresponding surfaces of an inclined ramp.

For a better understanding of the invention, and to show how the same may be carried into effect, reference will now be made, by way of example, to the accompanying drawings, in which.

Figure 1:
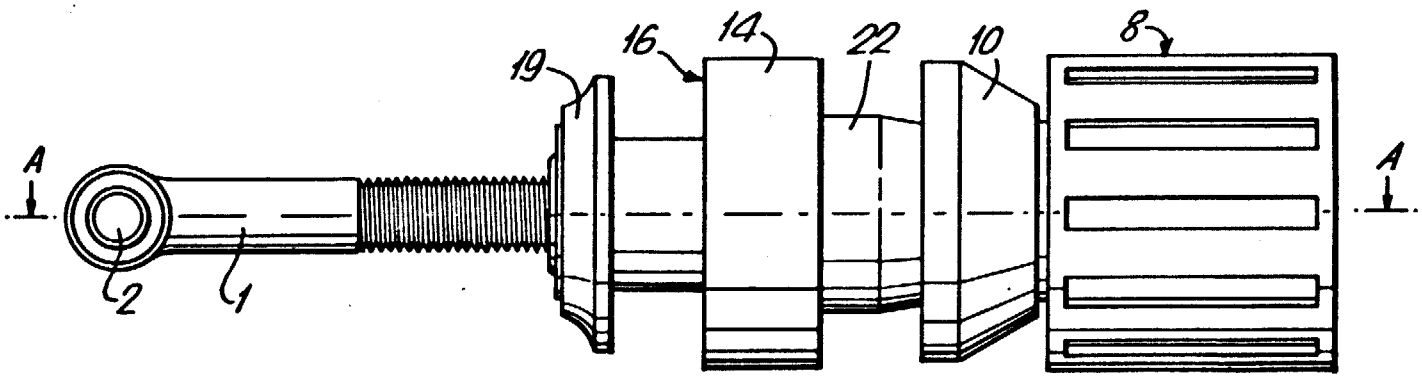
FIG. 1 is a side elevational view of apparatus in accordance with the present invention.
Figure 2:
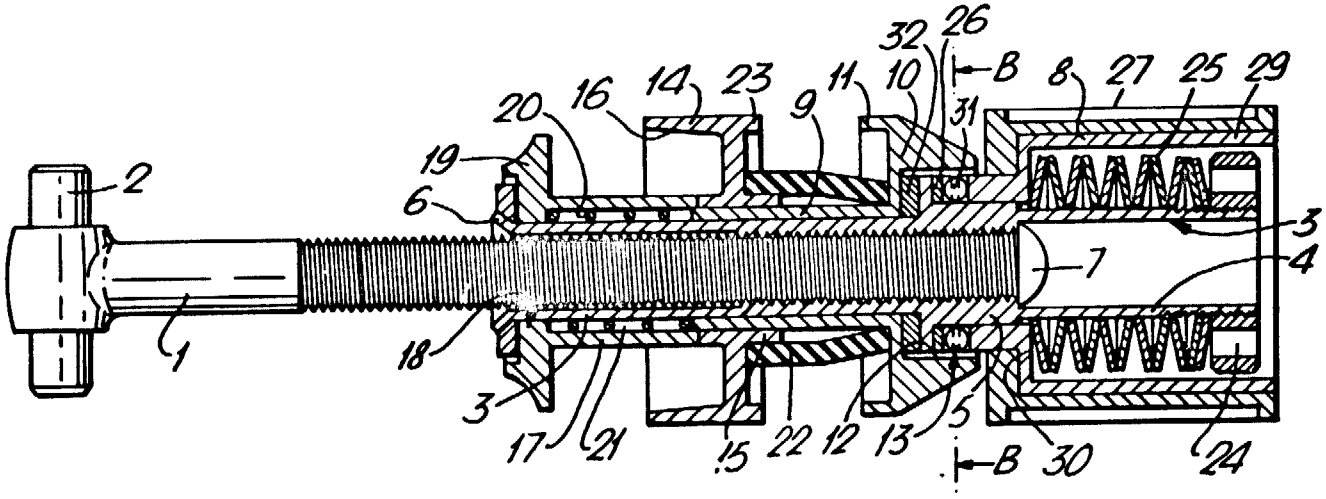
FIG. 2 is a partial cross-sectional view along the lines A—A of FIG. 1.

Referring now to FIGS. 1 and 2 of the drawings, the apparatus comprises a threaded spindle 1 one end of which includes a transverse pin 2 for pivotally mounting the spindle in a retaining member attached to, or forming part of, an avionics tray (not shown). In use, this pivotal mounting will be such that the spindle can move about the transverse axis of pin 2, while being unable to rotate about its own longitudinal axis. A first sleeve 3 includes a first portion 4 remote from pin 2 and a second, internally threaded portion 5 which is screw-threaded onto the spindle 1. The internal diameter of portion 4 of sleeve 3 is slightly greater than the external diameter of spindle 1. The end of sleeve 3 closest to transverse pin 2 flares outwardly to constitute a first stop member 6. A second stop member 7, in this embodiment in the form of a cap threaded internally into spindle 1, is arranged to limit the movement of the first sleeve 3 with respect to spindle 1 in the direction away from transverse pin 2.

A rotatable grip 8 is fitted about the end of first sleeve 3 remote from transverse pin 2. The grip comprises a colour-coded rubber grip surface 27 secured to the periphery of a cylindrical section 29. Cylindrical section 29 has, at its right-hand end as seen in FIG. 2, a recess in which are disposed a pack of disc springs (e.g. Belleville washers) 25. These are held in position by an adjustable disc 24 which is threaded onto the end of the first sleeve 3 furthest from pin 2. This disc 24 urges the disc springs 25 against inner surface 30 of the rotating grip 8.

Figure 6:
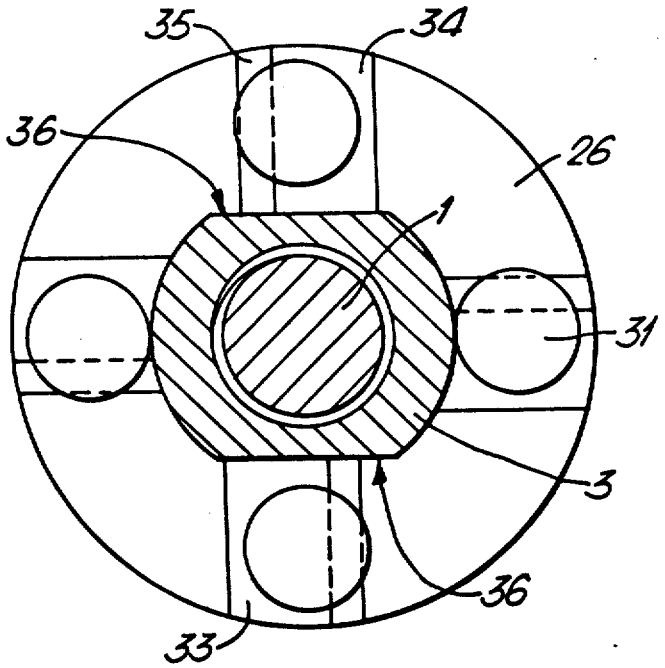
FIG. 6 is a sectional view, on an enlarged scale, of part of the apparatus shown in FIGS. 1 and 2.

A second sleeve 9 is coaxial with and positioned around the first sleeve 3. Sleeve 9 is preferably secured to the first sleeve 3. A radial flange 10 is formed at the end of sleeve 9 remote from pin 2. Flange 10 includes a shoulder 11 facing towards the pin 2 and an annular recess 12 which co-operates with the rotatable grip 8 and the first sleeve 3 to define an annular cavity around the first sleeve. In this cavity a torque limiting arrangement 13 is positioned. This comprises a drive plate 26 which is keyed to sleeve 3 and a plurality of ball bearings 31. Cavity 13 also includes a spacer member 32. A partial sectional view along lines B—B is shown in FIG. 6. As can be seen from this Figure, the drive plate 26 is associated with four ball bearings 31 each of which is seated in an indent 33. Each indent is "L"-shaped, having a relatively shallow sloping surface 34 and a relatively steep sloping surface 35. These two surfaces lie in planes which are 90 degrees apart. As seen from FIG. 6, the keying of drive plate 26 is effected through flats 36 formed in sleeve 3.

The torque limiting arrangement 13 is arranged such that rotation of the grip 8 in the direction causing sleeve 3 to move towards the transverse pin 2 continues so long as the torque between grip 8 and the sleeve 3 is less than a predetermined value. By adjusting screw 24, this predetermined torque value can be set appropriately.

Annular ring 14 is mounted for sliding movement on the outer surface of the second sleeve 9. The ring 14 includes a sleeve portion 15 coaxial with the second sleeve 9, and an internal surface 16 open towards the transverse pin 2. A shoulder 23 is also provided on the ring, this shoulder facing towards, and being capable of abutting, the shoulder 11 of sleeve 9. A generally cylindrical, elastomeric spacer element 22 is held captive between the radial flange 10 of second sleeve 9 and the right-facing end of the ring 14. When the ring 14 and flange 10 move towards each other, their respective shoulders 11 and 23 come into abutment so as to retain the compressed elastomeric spacer element 22 within the cavity formed between members 14 and 10.

A third sleeve 17 is coaxial with and positioned for relative sliding movement over that part of the outer surface of second sleeve 9 nearest to the transverse pin 2. Sleeve 17 is retained at the left hand end as seen in FIG. 2 by stop member 6. At the same end, the third sleeve 17 has a radially inwardly facing abutment 18 which holds the third sleeve 17 away from the first sleeve 3. Abutment 18 also defines, in co-operation with the inner surface of the third sleeve 17, the outer surface of the first sleeve 3 and the end of the second sleeve 9, a sheath-like cavity 21 around first sleeve 3. A resilient element 20 is located in cavity 21 and is arranged so as to tend to urge the third sleeve 17 away from second sleeve 9 in the axial direction of the spindle 1. Third sleeve 17 also includes a radially outwardly extending flange 19 at the end adjacent to transverse pin 2. The other end of sleeve 17 is in contact with the radially inward part of the ring 14.

The operation of the apparatus illustrated in FIGS. 1 and 2 will now be described with reference to FIGS. 2, 3, 4 and 5.

Figure 3:
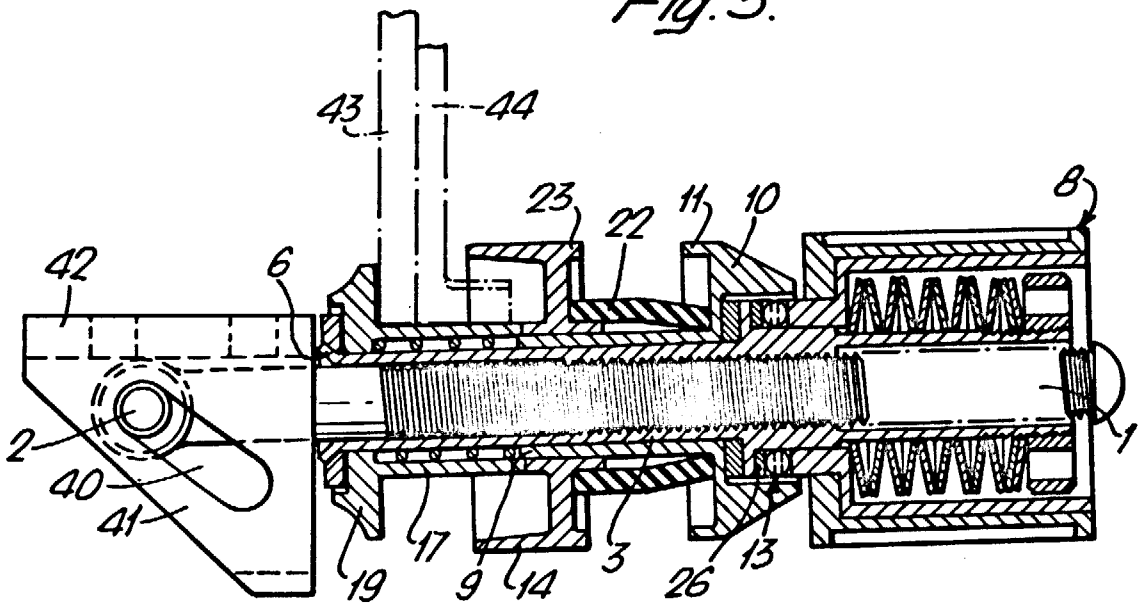
FIG. 3 is a cross-sectional view similar to that of FIG. 2, but showing the apparatus in a first, operative configuration.
Figure 4:
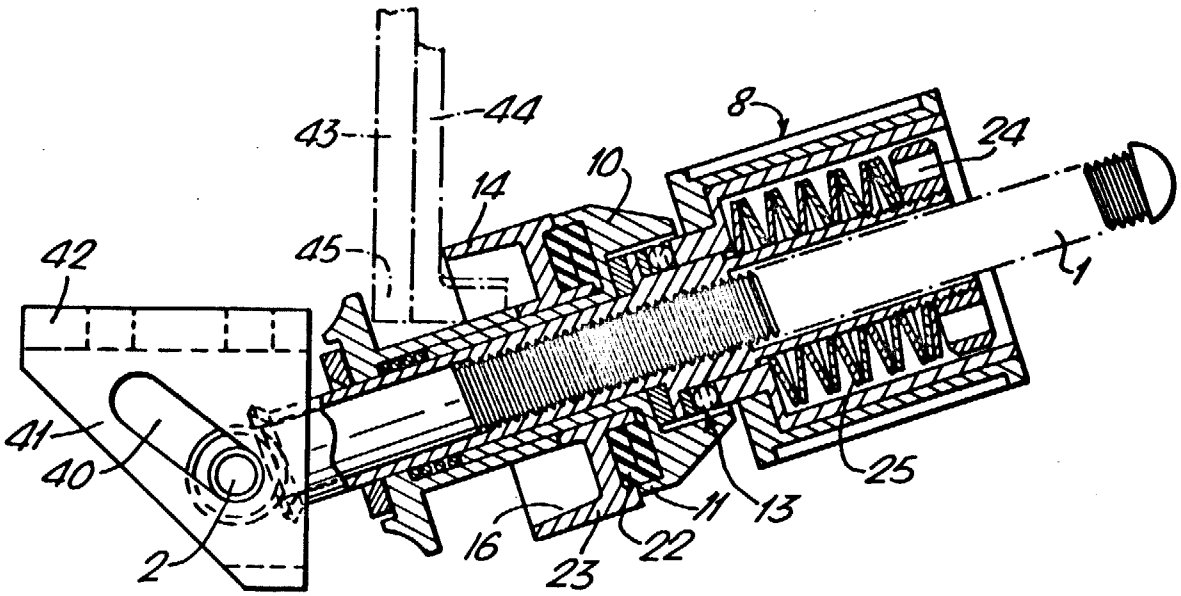
FIG. 4, is similar to FIG. 2, but with the apparatus in a second, operative configuration.

As shown in FIGS. 3 and 4, the transverse pin 2 is located in a slot 40 formed in a retaining member 41.

The retaining member 41 is secured to the lower part 42 of an avionics rack (not shown). The avionics rack supports an electronic unit which includes a front plate 43 having attached thereto a generally L-shaped hook 44. Front plate 43 includes a lower portion 45 which extends somewhat below the generally flat, bottom surface of the electronics unit which is supported on rack 42.

In FIG. 3, the apparatus of this invention is shown in the configuration applicable to its use in extracting the electronics unit from the rack or tray on which it is supported. In this configuration, the lower part 45 of front plate 43 and the toe of hook 44 are engaged between flanges 19 and 14 of the apparatus. Rotating grip 8 is rotated in a direction such as to move first sleeve 3 towards the right-hand end of spindle 1 as shown in the drawing. Torque is transferred through the arrangement 13 to plate 26, which as shown in FIG. 6 is keyed onto sleeve 3. Second sleeve 9 is fixed with respect to first sleeve 3, and third sleeve 17 is held in position between taper ring 14 and the enlarged end portion 6 of first sleeve 3, which acts as a retaining member. The jaw-like flange 19 of third sleeve 17 is thus caused to exert force on the rear portion 45 of front plate 43, thus pulling the electronics unit to the right as shown in FIG. 3, thereby extracting the unit from its support tray and simultaneously effecting disconnection of the electronic connections associated with the unit. During an extraction operation, the transverse pin 2 is held in slot 40 in the position illustrated in FIG. 3. The slot 40 is generally similar in function to that described and illustrated in U.S. Pat. No. 3,147,005.

When the apparatus of the invention is used to insert an electronics unit, the configuration shown in FIG. 4 is adopted. Rotating grip 8 is turned in the direction causing sleeve 3 to move to the left as shown in the drawing, the overall effect being that the inward facing surface 16 of taper ring 14 pushes against the toe of hook 44, thus moving the electronics unit to the left and effecting the necessary electrical connections. As the apparatus moves from the configuration shown in FIG. 3 to that shown in FIG. 4, rotation of grip 8 initially brings the toe of hook 44 into engagement with the surface 16 of ring 14. As the grip is tightened further, shoulders 11 and 23 are brought together against the force of the elastomeric coupling element 22. Eventually, shoulders 11 and 23 meet to give the arrangement shown in FIG. 4, where elements 22 is trapped in the cavity defined by co-operating surfaces of taper ring 14 and flange cam. Further rotation of the grip 8 acts to move the electronics unit to the left, as indicated above.

The torque limiting arrangement 13 is effective during the insertion mode. By adjusting the disc springs 25 via threaded disc 24, the limiting torque can be varied according to that desired for any particular application. When the electronics unit is fully seated on the avionics tray and the electronic connections have been effected, further rotation of rotating grip 8 will have no effect other than to cause the torque limiting arrangement 13 to slip. In the embodiment illustrated, the torque limiting arrangement 13 is effective only in the insertion mode: in other words, the arrangement 13 acts as a direct drive when rotating grip 8 is rotated in the sense required to extract the electronics unit from the rack, i.e. as described above with reference to FIG. 3.

Figure 5:
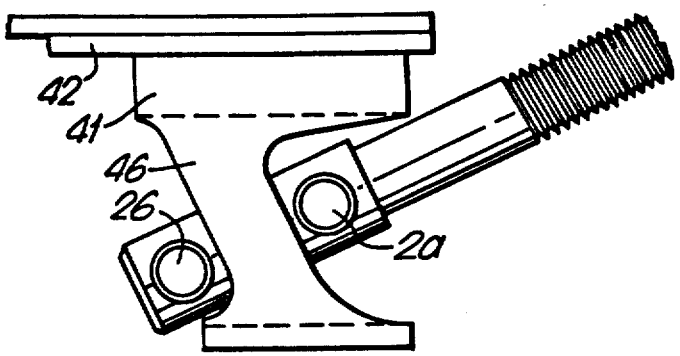
FIG. 5 is a view of an alternative form of retaining device for the apparatus of FIG. 1.

FIG. 5 shows an alternative mounting arrangement for apparatus of this invention. Instead of a slot 40, the mounting means 41 includes an inclined ramp 46 the opposite surfaces of which co-operate with two transverse pins 2*a* and 2*b* respectively.

What is claimed is:

1. Apparatus for removing and securing a plug-in electronic unit *or the like* from or to an avionics tray, which apparatus comprises (i) a threaded spindle one end of which includes a transverse pin for pivotally mounting the spindle in a retaining member attached to or forming part of the avionics tray such that the spindle can move about the transverse axis of said pin but cannot rotate about its own axis;

(ii) a first sleeve having a first portion relatively remote from the transverse pin and having a second, internally threaded portion which is threaded onto the spindle, the internal diameter of the first portion being slightly greater than the external diameter of the spindle;

(iii) a first stop member formed in or attached to the end of the first sleeve nearest to the transverse pin;

(iv) a second stop member arranged to limit the movement of the first sleeve with respect to the spindle in a direction away from the transverse pin;

(v) a rotatable grip fitted about that end of the first sleeve remote from the transverse pin;

(vi) a second sleeve coaxial with, and positioned around the first sleeve and having at its end remote from the transverse pin a radial flange including a shoulder facing towards the transverse pin, and an annular recess which cooperates with the rotatable grip and the first sleeve to define an annular cavity around the first sleeve;

(vii) a torque limiting arrangement positioned in said annular cavity and serving to interconnect the rotating grip and the first sleeve such that rotation of the grip in the direction towards the transverse pin causes the first sleeve to move along the threaded portion of the spindle towards the transverse pin so long as the torque between grip and said first sleeve is less than a predetermined value;

(viii) a ring member including (a) a sleeve portion coaxial with and positioned for sliding movement on the outer surface of the second sleeve, (b) an internal surface open towards the transverse pin, and (c) a shoulder facing inwards, and capable of abutting, the shoulder of the second sleeve;

(ix) a third sleeve coaxial with and positioned for relative sliding movement over that part of the outer surface of the second sleeve nearest to the transverse pin, the third sleeve being retained at its end nearest to the transverse pin by the first stop member and having, at that end, (a) a radially inwardly facing abutment which holds the third sleeve away from the first sleeve and which defines in cooperation with the inner surface of the third sleeve the outer surface of the first sleeve and the end of the second sleeve, a sheath like cavity around the first sleeve, and (b) a radially outwardly extending flange, the other end of said third sleeve being in contact with the radially inward part of the taper ring;

(x) a resilient element located in said sheath-like cavity and arranged so as to tend to urge the second and third sleeves away from one another in the axial direction of the spindle;

(xi) a generally cylindrical, elastomeric spacer element held between the radial flange of the second sleeve and that end of the ring member remote from the transverse pin, the arrangement being such that when the ring member and said radial flange move towards each other, their respective shoulders come into abutment so as to retain the compressed elastomeric spacer element within a cavity defined between the ring member and said radial flange; and (xii) means for urging the rotating grip towards the torque limiting arrangement.

2. Apparatus as claimed in claim 1, wherein said second sleeve is fixed to said first sleeve.

3. Apparatus as claimed in claim 1, wherein said second sleeve is free to slide over said first sleeve.

4. Apparatus as claimed in claim 1, wherein said torque limiting arrangement comprises a plurality of ball bearings held against the surface of a drive plate, which surface is formed with a number of indents.

5. Apparatus as claimed in claim 4, wherein each of said indents is generally "L"-shaped in section.

6. Apparatus as claimed in claim 4 *or* 5, wherein said drive plate is keyed to the spindle.

7. Apparatus as claimed in claim 1, wherein said torque limiting arrangement comprises a pack of disc springs housed in an annular cavity formed between an outer wall portion of said rotating grip and the outer surface of said first sleeve, the disc springs being urged towards an inner face of the rotating grip through the action of an adjustable screw arrangement.

8. Apparatus as claimed in claim 1, wherein the rotating grip or at least an outer surface portion thereof is colour-coded to indicate the maximum limiting torque to which the torque limiting arrangement can be set.

9. Apparatus as claimed in claim 5, wherein said drive plate is keyed to the spindle.

* * * * *